United States Patent [19]

Berlincourt

[11] Patent Number: 5,296,749

[45] Date of Patent: Mar. 22, 1994

[54] SUPERCONDUCTOR MICROELECTRONIC DEVICES AND CIRCUITS AND A METHOD OF FABRICATING THEREFOR

[75] Inventor: Ted G. Berlincourt, McLean, Va.

[73] Assignee: The United States of America as represented by the Secretary of the Navy, Washington, D.C.

[21] Appl. No.: 831,582

[22] Filed: Feb. 5, 1992

[51] Int. Cl.⁵ ............................................. H03K 17/92
[52] U.S. Cl. .................................... 307/306; 257/31; 307/245; 505/861
[58] Field of Search ............... 307/306, 245, 279, 476, 307/462; 505/826, 860, 861, 872; 257/30, 31, 35

[56] References Cited

U.S. PATENT DOCUMENTS

| | | | |
|---|---|---|---|
| 3,150,291 | 9/1964 | Laquer | 307/306 |
| 3,564,351 | 2/1971 | McCumber | 307/306 |
| 3,599,009 | 8/1971 | Parmentier et al. | 307/306 |
| 3,758,854 | 9/1973 | Zimmerman | 307/306 |
| 4,168,441 | 9/1979 | McDonald et al. | 307/306 |
| 4,749,888 | 6/1988 | Sakai et al. | 307/306 |

Primary Examiner—John Zazworsky
Attorney, Agent, or Firm—James T. Busch; Alfons F. Kwitnieski; Thomas E. McDonald

[57] ABSTRACT

Magnetic flux concentrating materials are introduced in superconducting microelectronic devices and circuits as a method and means for fabrication of more compact, higher speed superconducting microelectronic devices and circuits.

24 Claims, 1 Drawing Sheet

SUPERCONDUCTOR MICROELECTRONIC DEVICES AND CIRCUITS AND A METHOD OF FABRICATING THEREFOR

BACKGROUND OF THE INVENTION

1. Field of the Invention

The present invention relates to the use of magnetic flux concentrating materials for making more compact, lighter weight and faster microelectronic superconducting systems.

SUMMARY OF THE INVENTION

The present invention uses a paramagnetic, ferromagnetic, ferrimagnetic, or antiferromagnetic material in the vicinity of superconducting microelectronic circuits as a means of concentrating or compressing magnetic flux and thus shrinking circuit size. The greater density of circuits results in more compact and higher speed electronics. Combining superconducting materials and magnetic flux concentrating materials leads as well to novel microelectronic devices and circuits.

This approach makes possible completely novel microelectronic superconducting devices and circuits based on various possible combinations of hysteretic or: non-hysteretic current-voltage characteristic superconducting circuits with hysteretic or non-hysteretic magnetization magnetic materials. Older superconducting microelectronic circuits and devices have not employed high-magnetic-permeability materials to achieve smaller size, lighter weight, and higher speed. By mixing the different superconducting flux quantization states with the different hysteretic or non-hysteretic high-magnetic-permeability magnetic material states, whole new classes of devices and circuits are possible.

DETAILED DESCRIPTION OF THE INVENTION

Figure 1:
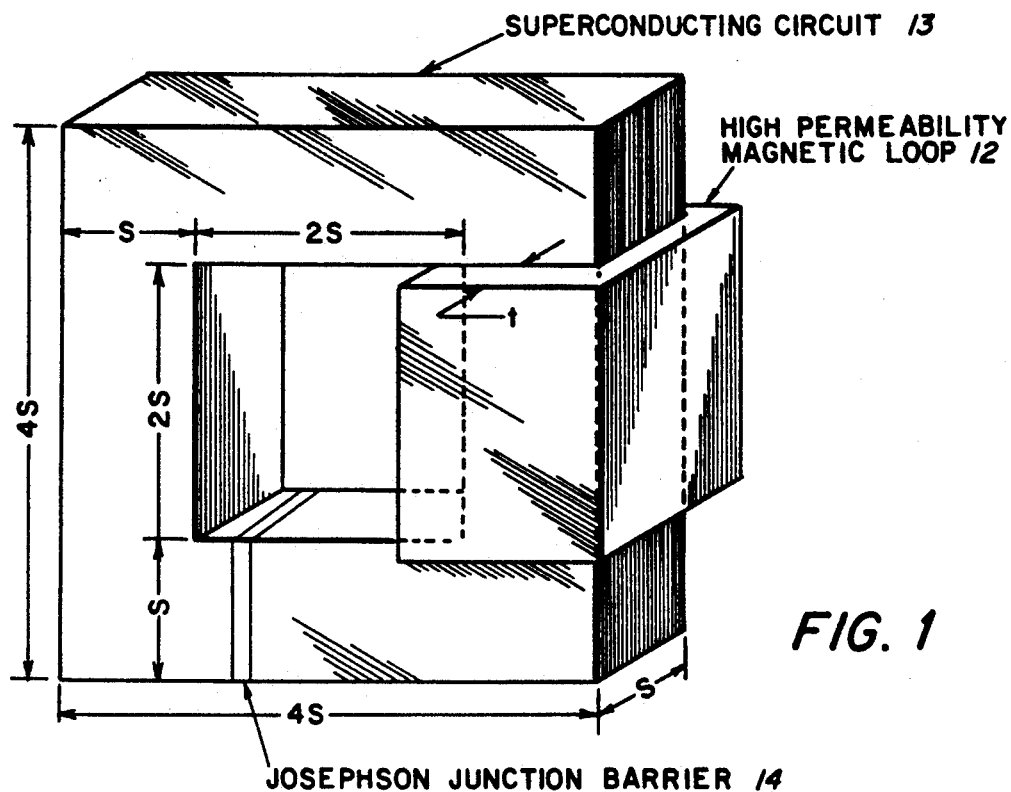
FIG. 1 is a perspective view of a microelectronic magnetically augmented superconducting circuit (MASC) used to describe the invention.

A superconducting microelectronic device or circuit is typically characterized by an inductance, L, defined as magnetic flux linkages per unit current, an operating current, i, and the amount of magnetic flux, $\phi$, linking the circuit, all related by $$L \propto \frac{\phi}{i}$$

In a superconducting microelectronic circuit the magnetic flux linking the circuit is typically zero or one magnetic flux quantum, $\phi_o = 2 \times 10^{-7}$ gauss-cm$^2$. Because $\phi_o$ is a relatively large quantity, traditional microelectronic unaugmented superconducting circuits (TUSCs) are larger than desired. It is possible, through addition of appropriately distributed high-magnetic-permeability materials, to concentrate magnetic flux and hence to reduce the sizes of superconducting circuits. In doing so, it is desirable not to increase the inductance of the circuit, because any increase in inductance reduces the switching speed of the circuit. But as noted above the flux for a microelectronic superconducting circuit is typically $\phi_o$. Hence, if both L and $\phi_o$ are to be held constant while shrinking a superconducting circuit, then i must also be held constant. Of course, for constant $\phi = \phi_o$, any decrease in current must be compensated by an increase in L, or, alternatively, any decrease in L must be compensated by an increase in current. In the examples discussed below, a TUSC and a shrunken microelectronic magnetically augmented superconducting circuit (MASC), all values L, $\phi$, and i are kept constant purely for purposes of comparison of MASC with TUSC. In practice, any of these parameters can be varied within limits to suit particular circuit requirements.

Magnetic permeabilities of materials range from approximately unity to 100,000. Hence, for constant operating current, typically of the order of a few tenths of a milliampere in a superconducting microelectronic circuit, and for constant inductance, it would be theoretically possible, by immersing the circuit in a high-magnetic-permeability medium, to shrink the linear dimensions of the circuit by a factor of 100,000 (corresponding to a factor of $10^{10}$ increase in circuit density) and still maintain the same number of magnetic flux linkages. All of this follows from the linear dependence of magnetic flux on magnetic permeability, on current, and on a linear dimension of the circuit. However, in practice such extreme size reductions cannot be realized for various practical reasons. First, such extreme shrinkage would reduce the cross-section of the superconducting circuit film to such an extent that maintaining the current constant at about a few tenths of a milliampere would lead to a current density which would exceed the superconductor's critical current density. Second, such extreme reduction of the circuit size at such a constant current would lead to a magnetic field which would exceed the saturation magnetization of the high-magnetic-permeability material, and the leakage fields would exceed the critical magnetic field of the superconductor. Finally, it is not feasible to immerse the superconducting circuit completely in a high-magnetic-permeability medium.

Fortunately, however, significant and beneficial reductions in circuit dimensions can be achieved well before any of the above factors impose limitations. Indeed, linear shrinkages of a factor of ten or greater, corresponding to circuit density increases of 100 or greater, appear to be readily feasible. At such levels of shrinkage, a material with modest magnetic permeability of the order of 1,000 may be used in very modest amount, i.e., filling only a small volume in the vicinity of the circuit to provide just enough low reluctance flux linkage with the superconducting microelectronic circuit to allow linear shrinkage of the desired factor of the order of 10 or more. Electrically insulating magnetic materials of possible interest for such applications include, but are not limited to, zinc-manganese ferrite spinels or manganese-doped ferrite spinels. Electrically conducting magnetic materials of possible interest include permalloy or amorphous iron-cobalt-boron materials. Of course, for the electrically conducting materials it will doubtless be necessary to interpose an insulating layer between the magnetic material and the superconducting circuit, and also to deposit the magnetic material in laminar fashion interspersed with electrically insulating layers so as to minimize eddy current effects.

It is instructive to compare the size of a traditional microelectronic unaugmented superconducting circuit (TUSC), supporting a single magnetic flux quantum, with the size of a microelectronic magnetically augmented superconducting circuit (MASC), such as proposed in this invention, also supporting a single magnetic flux quantum. For the TUSC, a single circular loop of radius r, in centimeters, is assumed, having conductor cross-section typical of those in common use. To sufficient approximation the magnetic flux $\phi$ enclosed by the loop is given, in gauss-cm², by $$\phi \approx 2ir,$$

where i is the current in amperes. Setting $\phi$ equal to the magnetic flux quantum $\phi_o = 2 \times 10^{-7}$ gauss-cm², and assuming $i = 2 \times 10^{-4}$ ampere, yields $$r \approx 5 \times 10^{-4} \text{ cm}.$$

The area required by such a circuit is $$\pi r^2 \approx 7.9 \times 10^{-7} \text{ cm}^2.$$

For the MASC, the geometry shown in FIG. 1 is assumed. A loop 12 of high-magnetic-permeability material of thickness, t, envelops one segment of the square superconducting circuit 13 which includes Josephson Junction 14. The uncoated (non-magnetic) segments of the circuit would be used to incorporate Josephson junctions, other types of superconducting circuit elements, and circuit interconnections. The flux in the high-magnetic-permeability material, due to the current i in the superconductor, is given to sufficient approximation by $$\phi \approx \frac{\pi \mu i s t}{5(s+t)}$$

where $\mu$ is the magnetic permeability of the magnetic material. This may be rearranged to yield the required thickness t of the high-magnetic-permeability material. Thus, $$t = \frac{5\phi s}{\pi \mu i s - 5\phi}$$

Setting $\phi = \phi_o = 2 \times 10^{-7}$ gauss-cm² and $i = 2 \times 10^{-4}$ ampere, as in the case of the TUSC, and choosing $\mu = 1,000$ and $s = 2 \times 10^{-5}$ cm (a value close to the presently attainable lateral limit for photolithographic processing for microelectronic circuits) the necessary high-magnetic-permeability material thickness is found to be $$t \approx 1.72 \times 10^{-6} \text{ cm}$$

a thickness which is feasible to fabricate. The current density j in the superconducting circuit is $$j = \frac{i}{s^2} = 5 \times 10^5 \text{ amperes/cm}^2$$

which is in the allowable range. The magnetic induction in the high-magnetic-permeability material is $$B = \frac{\phi_o}{2st} = 2.9 \times 10^3 \text{ gauss}$$

which is comfortably less than typical values for saturation magnetization. As a consequence, the superconductor would not experience troublesome leakage fields.

The area required by the MASC is approximately $$16 s^2 = 6.4 \times 10^{-9} \text{ cm}^2$$

or a factor of roughly 100 less than for the TUSC, thus providing analytical verification of the above claims that MASCs can be much more densely packed than is possible with TUSCs.

One example of a particular application of the invention can now be discussed. The total magnetic fluxoid $\phi$ for a superconducting circuit is restricted to the following values $$\phi = n\phi_o$$

where $n = 0, 1, 2, 3, 4 \ldots \infty$

In a simple binary logic electronic system, $n=0$ may correspond to zero, and $n=1$ may correspond to one. Higher level logic systems can involve values of n greater than 1, as well as negative values of in which correspond to opposite magnetic polarity. Energetic considerations dictate emphasis on the three lowest energy states, viz., $n=0$ and $n=\pm 1$. Attempts to shrink the sizes of simple fluxoid-based superconducting microelectronic devices have encountered limits, because the fluxoid quantum is itself relatively large. Hence, to sustain a single fluxoid state at achievable current levels has heretofor required relatively large superconducting microelectronic circuits.

The present invention achieves significant size reductions in the superconducting microelectronic circuits through incorporation of magnetic materials, which concentrate magnetic flux. Through use of such magnetic materials in an appropriate geometry in the vicinity of a superconducting microelectronic circuit, a greater magnetic flux may be achieved for a given supercurrent level. Alternatively, for a fixed current level, a given amount of flux can be produced in a smaller space. For a hysteretic material (such as ordinary iron) the magnetic state reflects the history of the magnetic fields which have been applied to it. For example, an iron bar may exhibit no net magnetic moment initially. In this instance, it would not attract or repel an identical iron bar. When a magnetic field is applied along the long axis of such an "unmagnetized" bar and subsequently reduced to zero, the bar will be left with a north pole on one end and a south pole on the other end. If the applied magnetic field is next applied in the opposite direction and then reduced to zero, the bar will be left with the poles reversed. In contrast, a non-hysteretic magnetic material never exhibits a magnetic moment in zero applied field and its magnetic state is always the same single-valued function of the applied field, regardless of the past history of applied fields. In the present invention these two different types of magnetic materials provide for superconducting microelectronics circuits of different types. With a small loop of strongly paramagnetic material linking a superconducting microelectronic circuit in the manner that two links of a chain link each other, the single fluxoid quantum state is achieved at smaller superconducting circuit size and at smaller supercurrent level. Similarly, reductions in size and/or current may be achieved through use of a magnetic material which exhibits a remnant magnetization, e.g., a ferromagnetic material. In this latter instance the quantum states which represent the binary numbers zero and one are appropriate mixtures of the energy states of the superconducting circuit and the magnetic loop with which is is linked. Moreover, in this instance steady state supercurrents may be relatively small or even zero. In the latter case, current pulses may be used to switch between the binary states n=1 and n=−1. While superconducting circuits looped with non-hysteretic magnetic materials may enclose zero flux quanta, superconducting circuits looped with hysteretic magnetic materials will, after initialization, always enclose at least one flux quantum.

It is to be noted that the approach described here differs from the early magnetic core memory approach. In particular, in some embodiments of the approach described here, one could start with superconducting microelectronic circuits involving Josephson junctions, which perform logic and memory functions. One could then duplicate those circuits on smaller scale by incorporating magnetic-flux-concentrating magnetic materials. In contrast, the copper-wire skeleton of the early magnetic core memory cannot by itself perform logic or memory functions. Only with the addition of magnetic cores to the copper-wire skeleton do these functions become possible.

The looped-links-of-a-chain geometry described above, in which a superconducting microelectronic circuit is one link and a magnetic material forms the second link, is only one of a multitude of geometries which might be used to enhance magnetic flux density, to shrink size, and to reduce current.

Figure 2:
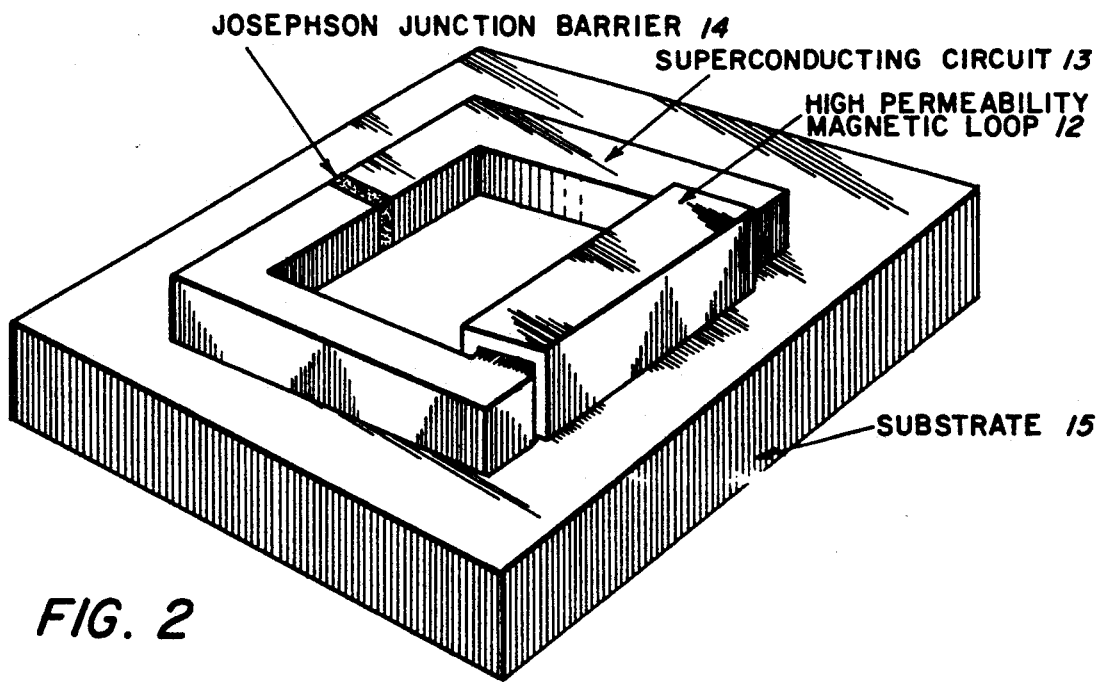
FIG. 2 illustrates the invention as it could appear after fabrication on a substrate.

FIG. 2, in which like elements are numbered as in FIG. 1, illustrates how a very primitive thin-film circuit of the invention might be fabricated on a substrate 15 by standard photolithographic techniques. A thin magnetic strip would first be deposited on the substrate to comprise the bottom side of the magnetic circuit. Next the superconducting circuit and Josephson junction would be deposited with one branch of the circuit overlying the magnetic strip. Finally, the sides and top of the magnetic circuit would be deposited, making use of glancing angle depositions to ensure coverage of the sides.

Of course, there are many material, geometry, and circuit parameters which can be varied in order to implement MASCs. The above is only one facet of a much larger class of possible MASC implementations. Also, in practical implementations care and some experimentation will be required for selection of the optimum high magnetic-permeability material for each particular application. In some applications, materials will be required which have negligible hysteresis, so that in the steady state the magnetic flux in the circuit is either $\pm\phi_o$ or zero. In other applications hysteresis may be desirable, so that the magnetic flux in the circuit is only $\pm\phi_o$ and never zero in the steady state. In all cases, it is essential that the high-magnetic-permeability material respond sufficiently rapidly to changes in circuit current so as not to introduce unacceptably long switching time constants.

Also in some applications a superconductive device which exhibits a hysteretic current-voltage (IV) characteristic is utilized, e.g., a Josephson junction while other applications would use a non-hysteretic current-voltage characteristic superconducting device, e.g., a weak link. Combination of either of the two above types of superconducting devices (hysteretic or non-hysteretic current-voltage characteristic) with either of the two magnetic material types (hysteretic or non-hysteretic magnetization) leads to four types of MASC devices. Complex superconducting microelectronic circuits may make use of any one type of MASC device or any combination of the four types of MASC devices.

I claim:

1. In a method of reducing the circuit area of a superconducting microelectronic circuit which ha a magnetic flux therein, the steps of; depositing a superconducting circuit on a substrate, enveloping a portion of said superconducting circuit with a coating of high magnetic permeability material so as to concentrate the magnetic flux of the superconducting circuit.

2. The method of claim 1 in which said magnetic material has a permeability which is greater than 100.

3. The method of claim 2 wherein the superconducting microelectric circuit is comprised of a thin film.

4. The method of claim 3 in which said superconducting circuit contains at least one Josephson junction.

5. The method of claim 3 in which said superconducting circuit exhibits a non-hysteretic current-voltage characteristic and said high magnetic permeability material exhibits a hysteretic magnetization characteristic.

6. The method of claim 3 in which said superconducting circuit exhibits a hysteretic current-voltage characteristic and said high magnetic permeability material exhibits a hysteretic magnetization characteristic.

7. The method of claim 3 in which said superconducting circuit exhibits a non-hysteretic current-voltage characteristic and said high magnetic permeability material exhibits a non-hysteretic magnetization characteristic.

8. The method of claim 3 in which said superconducting circuit exhibits a hysteretic current-voltage characteristic and said high magnetic permeability material exhibits non-hysteretic magnetization characteristic.

9. The method of claim 3 in which said magnetic material is an electrically insulating material from a group consisting of zinc manganese ferrite spinels or manganese-doped ferrite spinels.

10. The method of claim 3 in which said magnetic material consists of an electrically conducting material with an insulating material between said superconducting thin film circuit and said electrically conducting magnetic material.

11. The method of claim 10 in which said electrically conducting material consists of permalloy.

12. The method of claim 10 in which said electrically conducting material consists of an amorphous iron-boron mixture.

13. A superconducting microelectric circuit comprising:
  (a) a substrate;
  (b) a superconducting circuit in the form of a loop deposited on said substrate and having a magnetic flux therein and;
  a high permeability magnetic material completely surrounding a portion of said superconducting loop for the purpose of concentrating the magnetic flux of the superconducting circuit in a smaller area of the superconducting circuit.

14. The apparatus of claim 13 in which the magnetic permeability of said material is greater than 100.

15. The apparatus of claim 14 in which the superconducting microelectronic circuit is a thin film.

16. The apparatus of claim 14 in which said superconducting circuit contains at least one Josephson junction.

17. The apparatus of claim 14 in which said magnetic material is an electrically insulating material consisting of zinc-manganese ferrite spinels or manganese doped ferrite spinels.

18. The apparatus of claim 14 in which said magnetic material consists of an electrically conducting material with an insulating material between said superconducting thin film circuit and said electrically conducting material.

19. The apparatus of claim 18 in which said electrically conducting material consists of permalloy.

20. The apparatus of claim 18 in which said electrically conducting material consists of an amorphous ironboron mixture.

21. The apparatus of claim 14 in which said superconducting circuit exhibits a hysteretic current-voltage characteristic and said magnetic permeability material exhibits a hysteretic magnetization characteristic.

22. The apparatus of claim 14 in which said superconducting circuit exhibits a non-hysteretic current-voltage characteristic and said magnetic permeability material exhibits a non-hysteretic magnetization characteristic.

23. The apparatus of claim 14 in which said superconducting circuit exhibits a hysteretic current-voltage characteristic and said magnetic permeability material exhibits a non-hysteretic magnetization characteristic.

24. The apparatus of claim 14 in which said superconducting circuit exhibits a non-hysteretic current-voltage characteristic and said magnetic permeability material exhibits a hysteretic magnetization characteristic.

* * * * *